United States Patent [19]

Izuno et al.

[11] Patent Number: 4,943,857

[45] Date of Patent: Jul. 24, 1990

[54] SYNCHRONIZING CIRCUIT FOR AN EXTERNAL SIGNAL AND AN INTERNAL SAMPLING CLOCK SIGNAL

[75] Inventors: Nobuaki Izuno; Yasuo Kurosu, both of Yokohama; Koichi Okazawa, Tokyo; Yoshihiro Yokoyama; Kensuke Ooyu, both of Yokohama, all of Japan

[73] Assignee: Hitachi, Ltd., Tokyo, Japan

[21] Appl. No.: 184,394

[22] Filed: Apr. 21, 1988

[30] Foreign Application Priority Data

Apr. 24, 1987 [JP] Japan .................................. 62-102625
Nov. 13, 1987 [JP] Japan .................................. 62-286738

[51] Int. Cl.$^5$ ............................................. H04N 5/04
[52] U.S. Cl. ...................................... 358/148; 358/149
[58] Field of Search ............... 358/148, 158, 150, 151, 358/264, 265, 149; 375/118, 119

[56] References Cited

U.S. PATENT DOCUMENTS 4,617,679 10/1986 Brooks .................................. 375/119
4,757,264 7/1988 Lee et al. ............................. 358/148

FOREIGN PATENT DOCUMENTS 0006569 1/1981 Japan .................................. 358/265
0245731 11/1986 Japan .................................. 375/118

Primary Examiner—James J. Groody
Assistant Examiner—David E. Harvey
Attorney, Agent, or Firm—Antonelli, Terry & Wands

[57] ABSTRACT

A video signal and a horizontal synchronizing signal provided from a work station are delayed by a plurality of delay circuits having different delay amounts, and phase differences between a sampling clock signal and the delayed signals are detected. A clock generator generates two kinds of clock pulses having opposite phases and the same frequency. A clock selector selects one of the clock pulses as a sampling pulse signal in response to the phase differences. Further, a phase difference between the horizontal synchronizing signal and the video signal is detected so that the phase difference between the horizontal synchronizing signal and the video signal is maintained constant.

5 Claims, 7 Drawing Sheets

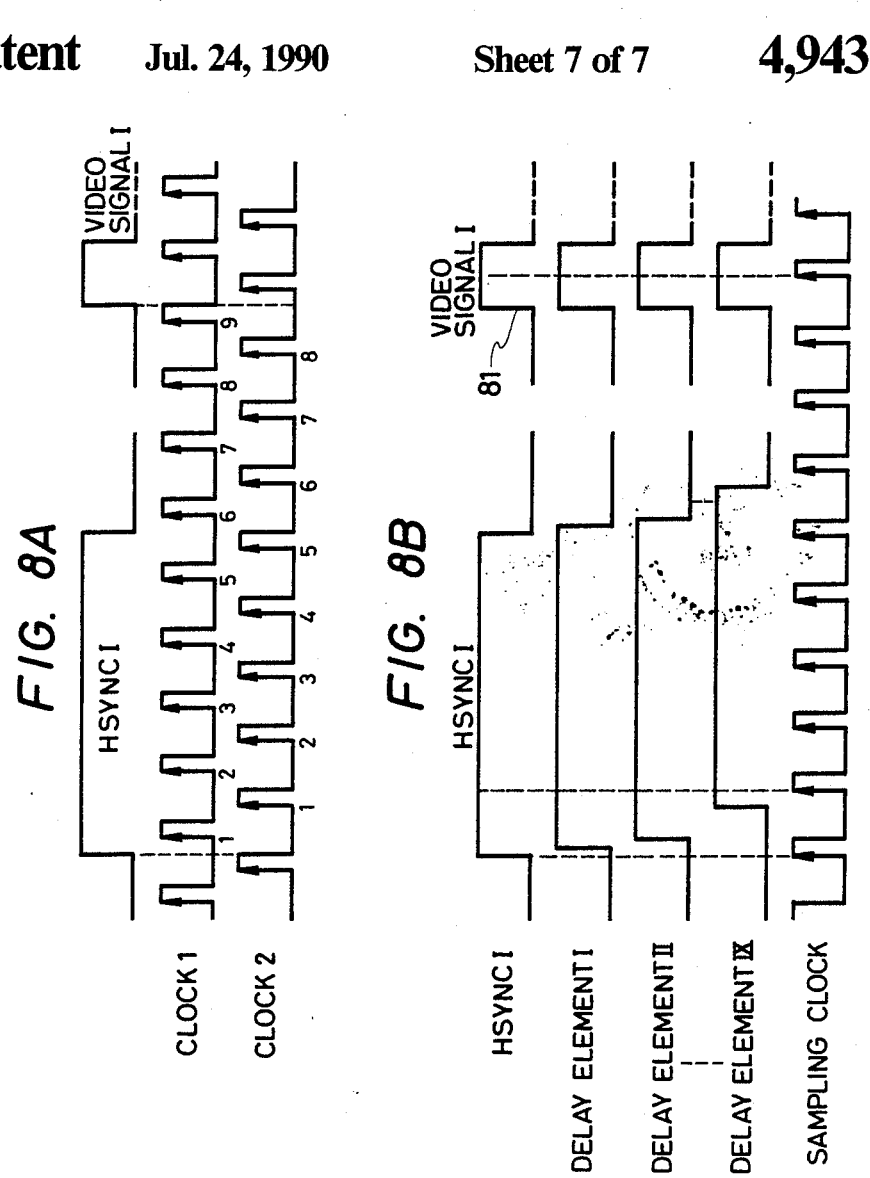

SYNCHRONIZING CIRCUIT FOR AN EXTERNAL SIGNAL AND AN INTERNAL SAMPLING CLOCK SIGNAL

BACKGROUND OF THE INVENTION

The present invention relates to a circuit for synchronizing an external video signal with an internal sampling signal, especially a synchronizing circuit for a video signal and a sampling clock suitable to convert the video signal to a digital signal in an image processing apparatus.

In a circuit for digitalizing an input video signal and supplying a digitalized video signal to an image processing circuit, there occur some data disturbances, for example, bit errors of the digitalized video signal, caused by a phase or frequency shift between the digitalized video signal and a sampling clock generated in the circuit. These disturbances have a remarkable influence on characters displayed on computer terminals. Namely, the characters displayed on a cathode ray tube (hereinafter, CRT) are represented by a small dot matrix, for example, 16×16 or 24×24 dots, which are determined by the CRT resolution. Therefore, there is some possibility that the characters may become indistinct even in case of one dot deviation.

Japanese Laid Open Patent Application No. 16288/83 (Tokkai Sho 58-16288) discloses apparatus for resolving the above mentioned problem.

FIG. 1 shows a block diagram of the prior art. A horizontal synchronizing signal 120 supplied from a transmission side is input to an inverter 122 and a D terminal of a flip flop 123. The inverter 122 inverts a supplied "1" level and provides a "0" level to the delay circuit 124. The delay circuit 124 delays the "0" level by periods TD, 2TD, ..., 8TD and supplies them to flip flops 125. In this state, when a sampling clock signal 121 is supplied to a CK terminal of the flip flop 123, the "1" level provided on the D terminal thereof is latched and a leading edge at a Q terminal is supplied to a CK terminal of the flip flops 125. The sampling clock signal 121 has the same frequency as one of the transmission side. The flip flops 125 latch signals provided on input terminals D0 to D7 at the leading edge of the Q terminal, and outputs them via corresponding terminals Q0 to Q7. A priority encoder 126 encodes signals supplied to terminals P0 to P7, when a "0" level signal is supplied to an EI terminal. The encoder 126 outputs a code signal corresponding to a differential period between the sampling clock signal 121 and the horizontal synchronizing signal 120.

Further, a video signal 129 provided from the transmission side is delivered to a delay circuit 128. The delay circuit 128 delays the video signal 129 by a plurality of delay times and supplies it to D terminals D0 to D7 of a multiplexer 127. The multiplexer 127 receives the code signal corresponding to the differential period and selects the delayed video signal in response to the code signal. As a result, a phase difference between the video signal 129 and the sampling clock signal 121 is compensated.

As mentioned above in detail, the phase error between the supplied horizontal synchronizing signal and the inner generated sampling clock signal is detected, and the phase of the supplied video signal is corrected in response to the phase error, so that it becomes possible to sample the supplied video signal accurately without dot errors.

However, in this prior art arrangement, since the horizontal synchronizing signal is used for detecting the phase error between the supplied video signal and the sampling clock signal, it is necessary that a phase relation between the video signal and the horizontal synchronizing signal is constant.

In a general video apparatus using a CRT, the phase difference between the horizontal synchronizing signal and the video signal is not compensated. As a result, in this prior art arrangement, there remain some possibilities to cause dot errors in a displayed picture. Namely, in case of applying the above mentioned prior art to each apparatus having an intrinsic phase difference between the horizontal synchronizing signal and the video signal, it is necessary to set a predetermined delay amount of the video signal to the horizontal synchronizing signal in each apparatus.

SUMMARY OF THE INVENTION

It is an object of the present invention to provide a synchronizing circuit for synchronizing an internal sampling clock signal with an external video signal without consideration to a phase difference between a horizontal synchronizing signal and the video signal.

It is another object to provide a synchronizing circuit for sampling a video signal without dot errors in a display picture, even if the video signal is not phase-compensated to a horizontal synchronizing signal, or the video signal is input after a long time absence of the video signal.

In the present invention, to attain the above objects, a synchronizing circuit includes a delay circuit for delaying an external video signal by a plurality of delay amounts, a phase detecting circuit for detecting a phase relation between a sampling clock signal and a plurality of the delayed video signals, a clock generating circuit for generating at least two clock signals having different phases, and a selector for selecting one of the clock signals as a sampling clock signal in response to an output of the phase detecting circuit.

Further, in the present invention, a synchronizing circuit comprises a clock generating circuit for generating two kind of clock pulses having opposite phases, a clock selecting circuit for selecting one of the clock pulses, a detector for detecting a phase difference between the selected clock pulse and a composite signal of a video signal and a horizontal synchronizing signal and driving the clock selecting circuit in response to the detected phase difference, and a detector for detecting a phase difference between the video signal and the horizontal synchronizing signal and relatively correcting the phase difference. The phase detecting circuit for detecting the phase difference between the sampling clock signal and the plurality of the delayed video signals contains a plurality of latch circuits for latching the delayed video signals by the sampling clock signal, respectively.

DETAIL DESCRIPTION OF THE PREFERRED EMBODIMENTS

Figure 1:
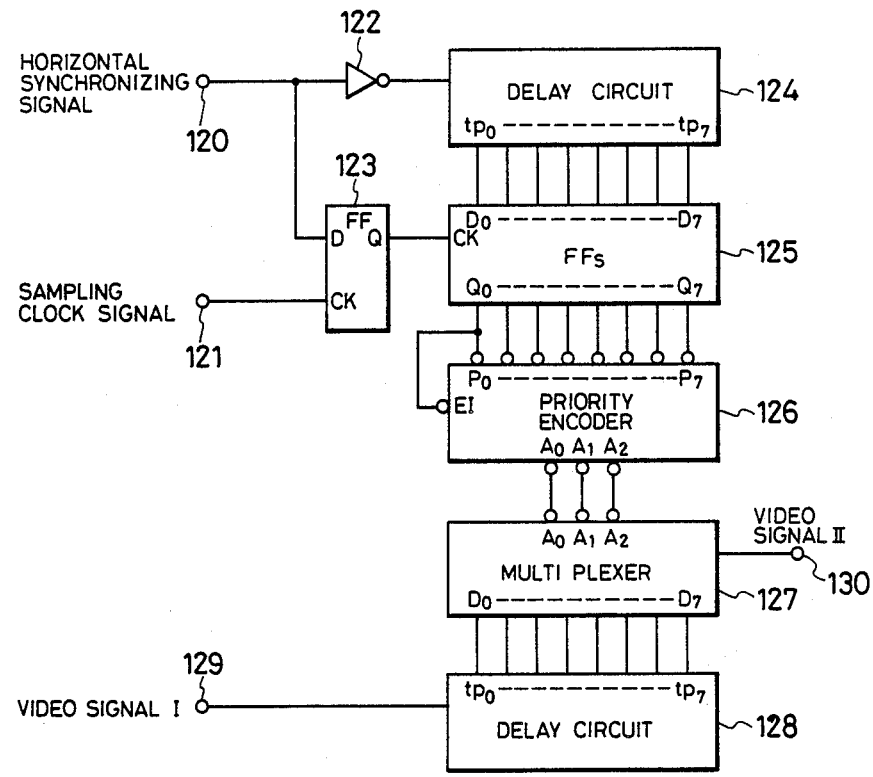
FIG. 1 shows a block diagram of a synchronizing circuit in the prior art.
Figure 2:
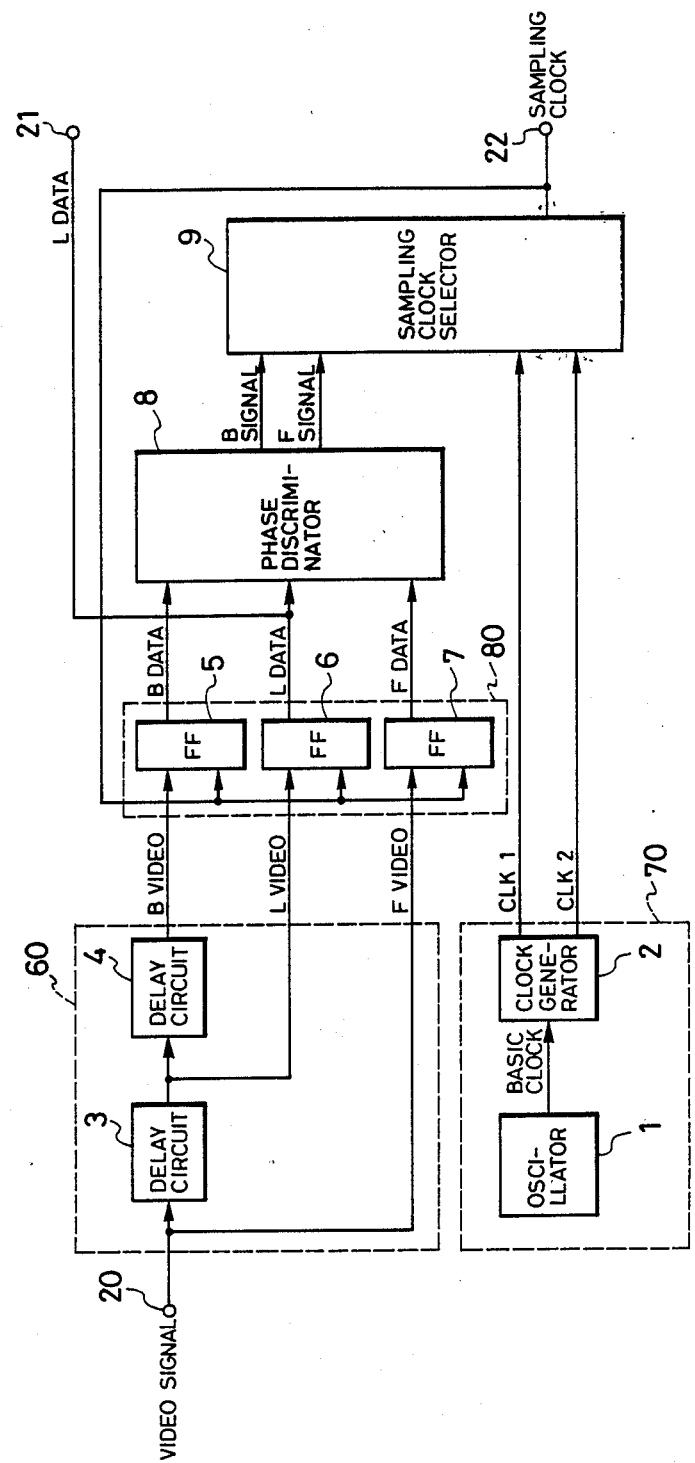
FIG. 2 shows a block diagram of an embodiment of the present invention.

FIG. 2 shows a block diagram of an embodiment of a synchronizing circuit of the present invention. The synchronizing circuit includes an oscillator 1, a clock generator 2, delay circuits 3 and 4, flip flop circuits (hereinafter, abbreviated to FFs) 5 to 7, a phase discriminator 8 and a sampling clock selector 9. The delay circuits 3 and 4 are used as a delay means 60, and the FFs 5 to 7 are used as a phase latching means 80. Further, the oscillator 1 and the clock generator 2 form a clock supplier 70. The numeral 20 denotes an input terminal of a video signal FVIDEO.

The oscillator 1 oscillates to produce a basic clock signal of a frequency 105.828 MHz. The clock generator 2 produces a clock pulses CLK1 and CLK2 based on the basic clock signal. The clock pulses CLK1 and CLK2 have a frequency 52.914 MHz, a duty ratio 1:3, and have 180 degrees phase difference.

The delay circuit 3 provides a signal LVIDEO, which is the video signal delayed by 4.17 ns to the signal FVIDEO. The delay circuit 4 delivers a signal BVIDEO, which is the video signal delayed by 4.12 ns to the signal LVIDEO. The FF5 latches the signal BVIDEO, the FF6 latches the signal LVIDEO, and the FF7 latches the signal FVIDEO. The FFs 5 to 7 receive a sampling clock and respectively latch the phases of the signals BVIDEO, LVIDEO and FVIDEO at the leading edge of the sampling clock. Outputs BDATA, LDATA and FDATA of the FFs 5 to 7 are supplied to the phase discriminator 8. At an output terminal 21, the LDATA6, which corresponds to the input video signal FVIDEO, is delivered to a post processor.

Figure 4:
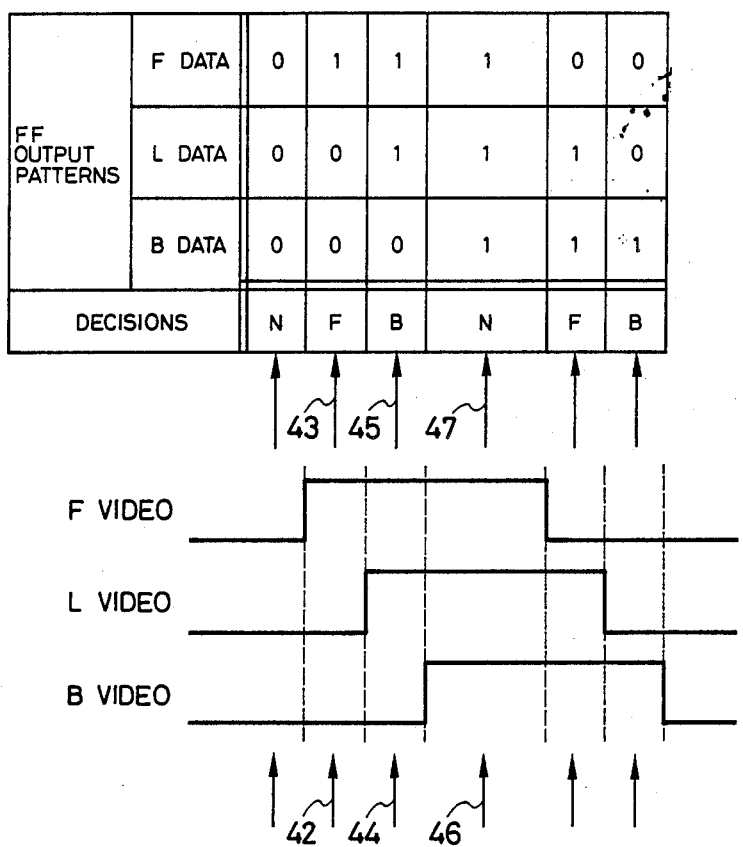
FIG. 4 illustrates a timing chart and a decision criteria for explaining the operation of the embodiment shown in FIG. 2.

As shown in FIG. 4, there are six sets of patterns of the BDATA, LDATA and FDATA. The phase discriminator 8 provides B or F signals in accordance with B, F or N decisions based on the six sets of the patterns, that is, provides the B signal in case of the B decision, or the F signal in the case of the F decision.

The sampling clock selector 9 selects the clock pulses CLK1 and CLK2, depending on whether the phase discriminator 8 outputs the B signal or the F signal. For example, when the B signal is supplied, a selected clock CLK1 or CLK2 is changed to a non-selected clock CLK2 or CLK1 at the trailing edge of the non-selected clock CLK2 or CLK1, and the newly selected sampling clock is provided to the output terminal 22 and the FFs 5 to 7. Further, when the F signal is supplied, the selected clock CLK1 or CLK2 is changed to the non-selected clock CLK2 or CLK1 at the trailing edge of the selected clock CLK1 or CLK2, and the newly selected sampling clock is provided to the output terminal 22 and the FFs 5 to 7.

Figure 3:
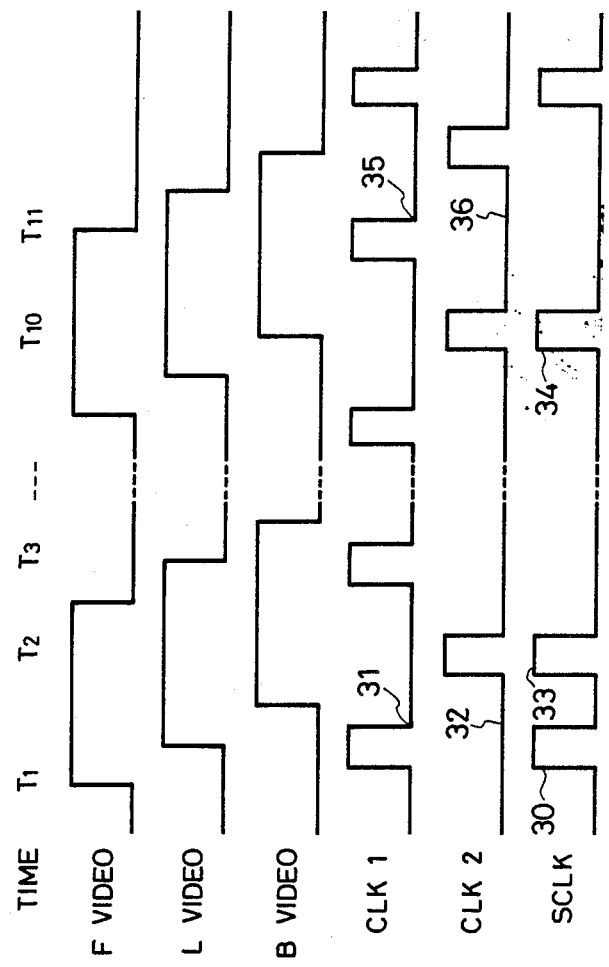
FIG. 3 illustrates a timing chart for explaining the operation of the embodiment shown in FIG. 2.

Next, the operation of the present embodiment will be explained more detail by using FIGS. 3 and 4. FIG. 3 illustrates a timing chart for explaining a time relation between the video signals and the sampling clock pulse.

First, the input video signal is delayed by the delay circuits 3 and 4 so as to produce the signals FVIDEO, LVIDEO and BVIDEO, which have phase relations shown in FIG. 3. Next, phase conditions of the signals BVIDEO, LVIDEO and FVIDEO latched by the FFs 5, 6 and 7 are detected at the time T1 shown in FIG. 3, that is, a leading edge 30 of the sampling clock (SCLK of the FIG. 3) delivered from the sampling clock selector 9.

Namely, since the phase condition of the sampling clock coincides with arrows 42 and 43 shown in FIG. 4, the BDATA, LDATA, and FDATA become "0", "0", and "1", respectively, which are provided to the phase discriminator 8. The phase discriminator 8 outputs the F signal to the sampling clock selector 9 in accordance with decision criteria shown in FIG. 4.

In response to the input F signal, the sampling clock selector 9 changes the sampling clock from the clock CLK1 to the clock CLK2 at the trailing edge 31 of the clock CLK1, and supplies the clock CLK2 to the output terminal 22 and the FFs 5 to 7.

Similar to the above description, at the time T2, that is, the leading edge 33 of the sampling clock pulse, the phase conditions of the BVIDEO, LVIDEO, and FVIDEO latched by the FFs 5, 6 and 7 are detected. Namely, since the phase condition of the sampling clock pulse coincides with the arrows 46 and 47, the BDATA, LDATA and FDATA become "1", "1" and "1", respectively. Therefore, the phase discriminator 8 does not change the sampling clock pulse in accordance with the criteria shown in FIG. 4. As a result, the sampling clock selected 9 does not execute the change operation.

Also, at the time T10, that is, the leading edge 34 of the sampling clock SCLK, the phase conditions of the BVIDEO, LVIDEO and FVIDEO latched by the FFs 5 to 7 are detected. Since the phase condition of the sampling clock coincides with the arrows 44 and 45, the BDATA, LDATA and FDATA become "0", "1", "1" and are supplied to the phase discriminator 8.

Next, the phase discriminator 8 provides the B signal to the sampling clock selector 9. In response to the B signal, the sampling clock selector 9 changes the sampling clock pulse from the clock CLK2 to the clock CLK1 at the trailing edge 35 of the clock pulse CLK1, and provides clock CLK1 as the SCLK to the output terminal 22 and the FFs 5, 6 and 7.

As described above, it becomes possible to synchronize a video signal having a high frequency with a sampling clock having approximately the same frequency, with no relation to the phase difference between the video signal and the horizontal synchronizing signal.

Next, a second embodiment of the present invention will be explained hereinafter. The first embodiment uses the video signal itself to detect the phase difference. Therefore, if there is no data to be displayed, the signal for detecting the phase difference would not be provided. As a result, there would remain some possibility of dot errors to an input video signal after a long time of non-display. The second embodiment provides a good solution to this problem.

Further, in general, the horizontal synchronizing signal and the video signal are not synchronized with the same clock signal. Therefore, as shown in FIG. 8A, there is some possibility that a dot number between the horizontal synchronizing signal and the video signal varies. This causes a disorder in a changing time between a blanking period and a display period, so that there occurs a one dot shift in a displayed picture. As characteristic of the horizontal synchronizing signal, the phase difference between the horizontal synchronizing signal and the video signal is constant. In the second embodiment, a plurality of delayed horizontal synchronizing signals are generated, and the one thereof having the best phase relation to the video signal is selected.

Figure 5:
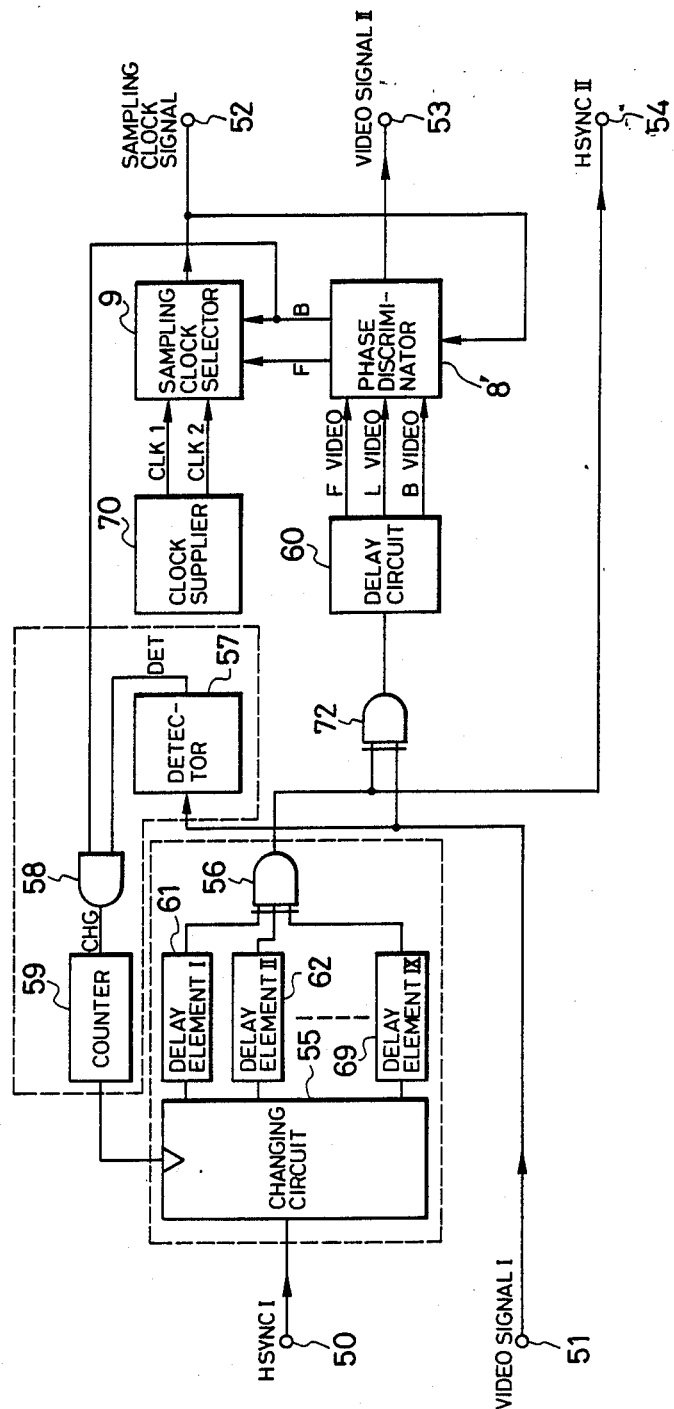
FIG. 5 shows a block diagram of another embodiment of the present invention.

FIG. 5 shows a block diagram of the second embodiment of the present invention. The numerals 50 and 51 denote input terminals of a horizontal synchronizing signal I (HSYNCI) and a video signal I, respectively. The numerals 52 to 54 designate output terminals of a sampling clock signal (SCLK), a video signal II and a horizontal synchronizing signal II (HSYNCII), respectively. The HSYNCI and the video signal I are delivered from a transmitting station, for example, a work station. The SCLK, the video signal II and the HSYNCII are provided to a post processor.

A changing circuit 55 changes the delay time for the HSYNCI by selecting a path to a plurality of delay elements (Delay I to IX) 61 to 69. An OR circuit 56 outputs the HSYNCII, which is an appropriately delayed HSYNCI. Another OR circuit 72 logically ORs the HSYNCII and the video signal I. As explained in the first embodiment, the delay means 60 produces three-phase signals, a phase discriminator 8', which includes three FFs for latching the three-phase signals, produces the B signal or the F signal, the clock supplier 70 supplies the two-phase clock signals CLK1 and CLK2, and the sampling clock selector 9 selects one of the clock signals CLK1 and CLK2.

The numeral 57 denotes a detector for detecting a leading part, 81 in FIG. 8B, of the video signal I, that is, a part of the video signal I which appears just after the horizontal synchronizing signal. The numeral 58 denotes an AND circuit, the numeral 59 designates a counter which cyclically increases the delay amount of the HSYNCI.

Figure 6:
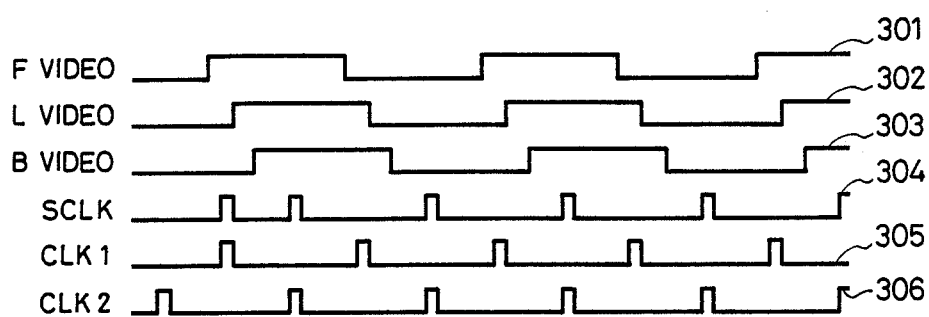
FIG. 6 illustrates a timing chart for explaining the operation of the embodiment shown in FIG. 5.

Next, the operation of the second embodiment will be explained by using FIGS. 6 and 7. The video signal supplied from the transmitting station and the HSYNCII are delivered to the OR circuit 72. In this embodiment, the dot frequency of the video signal I is 52 MHz. When power is supplied to the circuit, the clock supplier starts to output the clock signals CLK1 and CLK2, which have a frequency of 52 MHz, a duty ratio 1:3, and are of opposite phase to each other.

The output of the OR circuit 72 is provided to the delay circuit 60, so that the FVIDEO, LVIDEO and BVIDEO signals are produced as in the first embodiment. In this embodiment, the LVIDEO is delayed 2.40 ns to the FVIDEO. The 2.40 ns is equal to one eighth period of the video signal I. Further, the BVIDEO is delayed by 4.80 ns with respect to the FVIDEO. The FVIDEO, LVIDEO and BVIDEO are latched at the FFs in the phase discriminator 8', and the phase differences between them and the sampling clock signal 52 are detected. The FFs latch the video signals at the leading edge of the sampling clock signal 52. As explained in detail in the first embodiment, the phase discriminator 8' provides the B signal or the F signal in accordance with the criteria shown in FIG. 4. In case of the B signal, the sampling clock selector 9 changes the sampling clock signal after waiting for one period, and in case of the F signal, the sampling clock selector 9 changes the sampling clock signal immediately, as described in the former embodiment.

In the above description, the synchronizing operation of the video signal I, the HSYNCI and the sampling clock signal are explained. FIG. 6 shows a timing chart for it, where the video signal leads the sampling clock signal.

Next, it will be explained below how the phase difference between the HSYNCI and the video signal I is corrected. First of all, as explained before, the synchronization between the supplied HSYNCI and the sampling clock signal is executed. Second, the video signal I is supplied, synchronized with the sampling clock signal, and the phase difference between the HSYNCI and the video signal I is corrected if there exists a phase difference therebetween at the leading part of the video signal I.

Figure 7:
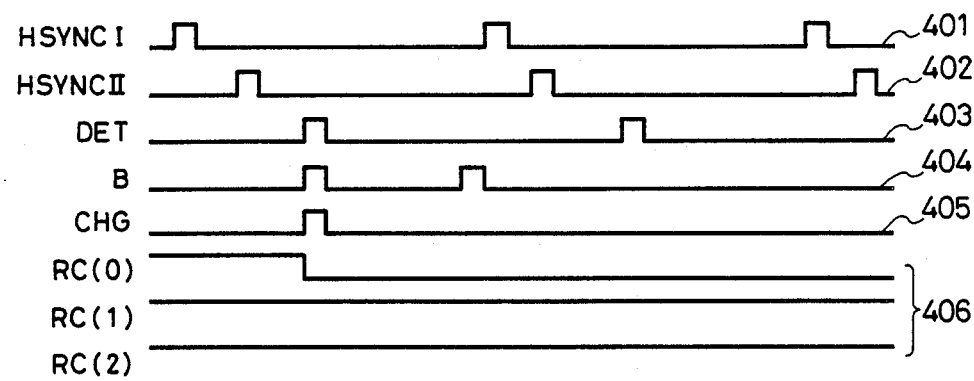
FIG. 7 illustrates another timing chart for explaining the operation of the embodiment shown in FIG. 5, and FIGS. 8A and 8B illustrate timing charts for explaining the operation of the embodiment shown in FIG. 5.

The detector 57 receives the video signal I, and provides a detecting (DET) signal 403 by detecting the leading part of the video signal I at every horizontal synchronizing period as shown in FIG. 7. The phase discriminator 8' outputs the B signal, if the video signal II is behind the sampling clock signal 52. When the leading part of the video signal I is not synchronized with the sampling clock signal, that is, when there exists a phase difference between the video signal I and the HSYNCI, the AND circuit 58 logically ANDs the DET signal 403 and the B signal 404, and outputs the CHG signal 405, so that the delay amount of the HSYNCI is changed. The CHG signal 405 is provided to the counter 59, which counts up a stored count number RC(0) to RC(2) 406. In response to the count number RC(0) to RC(2) 406, the changing circuit 55 selects one of the delay elements 61 to 69, so that the HSYNCI is delayed. If the phase difference between the HSYNI and the video signal I is not corrected by the delay amount change operation, the same operation is repeated. In FIG. 7, the numerals 401 and 402 indicate the HSYNCI and the delayed HSYNC, that is, the HSYNCII, respectively.

In the above second embodiment, the counter 59 counts up the number, but it is possible for the counter 59 to count down the number by using the F signal in lieu of the B signal. Further, in the above embodiment, the delay amount of the HSYNC is adjusted, but is effective to adjust a delay amount of the video signal.

As being mentioned above in detail, it becomes possible to correctly sample the video signal without the dot errors in the display picture, even if the video signal having no phase compensation to the HSYNC is supplied or the video signal is input after a long non-display.

What is claimed is:

1. A synchronizing circuit for synchronizing an input video signal with a sampling clock signal, comprising:
    delay means for delaying the input video signal by a plurality of delay amounts to produce a plurality of delayed video signals, each having the same waveform as said input video signal;
    detecting means connected to said delay means for detecting phase relations between the sampling clock signal and each of said delayed video signals;
    phase discriminating means connected to said detecting means for outputting an output signal representing said phase relations detected by said detecting means;
    means for supplying two kinds of clock signals having the same frequency and a phase difference of 180 degrees; and selecting means for selecting one of said two clock signals and for outputting the selected clock signal as the sampling clock signal, said selecting means either converting the sampling clock signal to the non-selected clock signal at the trailing edge of the non-selected clock signal or converting the sampling clock signal to the non-selected clock signal at the trailing edge of the selected clock signal in response to the output signal outputted by said phase discriminating means.

2. A synchronizing circuit according to claim 1, wherein:
said delay means includes two delay circuits connected in series and provides outputs from the respective delay circuits and an output in the form of the input video signal.

3. A synchronizing circuit according to claim 1, wherein:
said detecting means includes a plurality of flip flops for respectively latching said delayed video signals produced by said delay means in accordance with said sampling clock signal.

4. A synchronizing circuit for synchronizing an input video signal to be digitalized and provided to a post processor with a sampling clock signal, comprising:

a clock generator for generating two kinds of clock pulses having the same frequency and opposite phases;
selecting means for selecting one of said two kinds of clock pulses as the sampling clock signal;
first detecting means for detecting a phase difference between a selected clock pulse and a combined signal representing both the input video signal and an input horizontal synchronizing signal and providing a selecting signal to said selecting means;
second detecting means for detecting a phase difference between the input video signal and said input horizontal synchronizing signal; and
means for correcting the phase of said horizontal synchronizing signal in response to an output of said second detecting means.

5. A synchronizing circuit according to claim 5, wherein:
said first detecting means includes a delay means for delaying said combined signal by a plurality of delay amounts, latch means for latching said combined signal and the delayed combined signals at the timing of said selected clock pulse, and a phase discriminator connected to said latch means for discriminating a phase relation between said selected clock pulse and said combined signal in response to outputs of said latch means.

* * * * *